United States Patent [19]

Lebet et al.

[11] 4,404,741

[45] Sep. 20, 1983

[54] DEVICE FOR THE ALIGNMENT OF A PART AND A SUBSTRATE FOR CARRYING THE PART

[75] Inventors: Jean-Philippe Lebet, Les Geneveys; Leonardo Peterle, Buttes; Fernand Matthey-Doret, Le Locle, all of Switzerland

[73] Assignee: Les Fabriques d'Assortiments Reunies, Le Locle, Switzerland

[21] Appl. No.: 309,907

[22] PCT Filed: May 19, 1981

[86] PCT No.: PCT/CH81/00056

§ 371 Date: Oct. 9, 1981

§ 102(e) Date: Oct. 9, 1981

[30] Foreign Application Priority Data

May 19, 1980 [CH] Switzerland ............................ 3877/80
May 5, 1981 [EP] European Pat. Off. ......... 81.810170.1

[51] Int. Cl.³ .......................... H05K 3/30; H05K 13/04
[52] U.S. Cl. ........................................ 29/721; 29/740; 29/760; 29/833; 29/834; 74/479; 192/84 A; 228/6 A; 228/49 R; 269/73; 269/903

[58] Field of Search ................. 29/740, 741, 721, 760, 29/833, 834, 835, 836; 269/73, 71, 903; 74/479, 471 X; 192/84 A; 228/6 A, 180 A, 49 R, 49 A

[56] References Cited

U.S. PATENT DOCUMENTS

| 3,628,717 | 12/1971 | Lynch et al. | 228/49 R |
|---|---|---|---|
| 3,872,566 | 3/1975 | Pedrotti | 29/721 X |
| 3,909,933 | 10/1975 | Doubek, Jr. et al. | 228/10 X |
| 4,080,730 | 3/1978 | Woodman, Jr. | 29/760 X |
| 4,342,090 | 7/1982 | Caccoma et al. | 29/740 X |

Primary Examiner—Carl E. Hall
Attorney, Agent, or Firm—Berger & Palmer

[57] ABSTRACT

Device for the alignment of a part 12 and of a substrate 10 designed to receive it. The device contains a plate 2, on the horizontal flat upper surface 3 of which an XY table 5 can slide, a blocking device 16 for temporarily interrupting any translation of the XY table 5, but leaving it free to rotate on a given vertical axis 4, a gripping device 11 and an optical viewing device 15. The blocking device 16 preferably consists of an electromagnet mounted for rotation in a bore of the plate 2.

8 Claims, 2 Drawing Figures

DEVICE FOR THE ALIGNMENT OF A PART AND A SUBSTRATE FOR CARRYING THE PART

BACKGROUND OF THE INVENTION

This invention relates to a device for aligning a part and a substrate designed to receive it. It relates, in particular, to such a device adapted for mounting semiconductor microplates on a base carrying an electric circuit pattern.

Making an electrical and mechanical connection between a microplate and a substrate usually necessitates, before establishment of the connection, alignment of the plate with the substrate and then a second alignment of the plate-substrate assembly with a tool, e.g., a welding tool. There are devices in which the microplate is first oriented in relation to the tool and then integrated with that tool. The substrate is then aligned with the tool-microplate assembly.

That is why microplate mounting installations generally incorporate an alignment device containing, primarily, an XY moving table making it possible to move the part or the substrate in two orthogonal horizontal directions, the table being capable of turning on a vertical axis. The device also includes an optical device for monitoring the alignment operation. Schematically, each alignment operation, e.g., of a part and a substrate carried by the XY table, consists of moving the XY table in two orthogonal directions, so that the axes of the part and of the substrate are aligned, and then rotating the substrate, to angularly align it with the part. In most alignment devices, one finds that when the axis of the substrate does not coincide with the axis of rotation of the XY table, any rotation of the latter alters the position of the axis of the substate. It is then necessary, after rotation, to make a new XY adjustment in order to obtain perfect alignment.

In other present devices, the XY table is no longer made to turn on a fixed axis in relation to the mounting base of the installation, but it carries a support for the substrate, which is rotatably mounted on the XY table. It would then be sufficient to deposit the substrate on the support, so that its axis exactly matches the axis of rotation of the support, for the aforementioned problem to disappear. This entails, however, an additional alignment operation, which must, furthermore, be repeated in cases where the same substrate contains several sites for receiving parts. Another disadvantage of this approach is that the axis of rotation, no longer being fixed in relation to the mounting base of the installation, can deviate from the optical axis of the viewing device, which leads to new difficulties in then aligning the part-substrate assembly with the welding tool that is often also placed on the optical axis or at least on a parallel fixed axis. A shift between the optical axis and the part-support axis can further cause image distortions.

Still another disadvantage of the present devices is that, in order to make appreciable translations, e.g., to pass from one substrate site to another, it is necessary to use a slow moving XY table.

An object of this invention is to provide an alignment device which simplifies and accelerates alignment operations by eliminating the defects of the devices of the prior art.

BRIEF DESCRIPTION OF THE DRAWING

The invention will be better understood by reading the following specification, given with reference to the enclosed drawings, among which.

DETAILED DESCRIPTION

Figure 1:
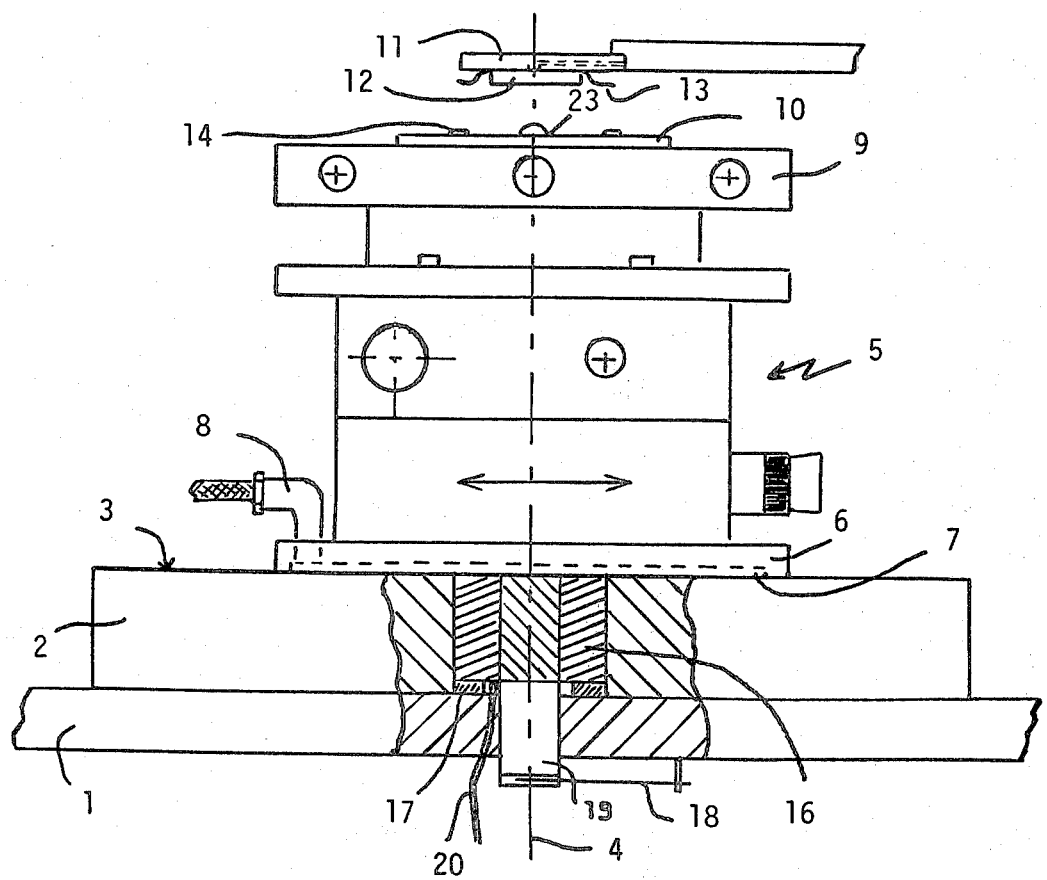
FIG. 1 is a view, in partial section, of one embodiment of the device according to the invention.

In FIG. 1, the mounting base 1 of the alignment device can also be, for example, that of a welding machine incorporating that device. A plate 2 has a horizontal flat upper surface 3, is integral with base 1 and contains a center bore of fixed vertical axis 4. An XY table 5 is mounted on a base 6 capable of sliding over surface 3 of plate 2. A recess 7 in the lower surface of base 6, connected by a pipe 8 to a high pressure source, makes it possible to facilitate that movement. Recess 7 can also be selectively connected to a low pressure source in order to immobilize table 5 on plate 2. A support 9 integral with the XY table is provided for substrate 10.

A gripping device, containing, for example, a suction nozzle 11, is adapted to take, approximately at an extension of vertical axis 4 and by means not represented, a part 12, consisting illustratively of a semiconductor microplate. The microplate is equipped with fastening lugs 13 to be connected to conductive points 14 formed in a corresponding pattern on substrate 10, and the gripping device is adapted to deposit the part 12 vertically on the substrate, where it can be held, for example, by a drop of adhesive material 23.

An optical device 15, also set up along an extension of axis 4, makes it possible to monitor the alignment operations.

The system of the invention also contains a blocking device for temporarily interrupting or preventing any translational movement of base 6 on surface 3 of plate 2, but allowing rotational movement thereof around vertical axis 4. This blocking device consists of electromagnet 16, freely mounted in the bore of plate 2, so that when it is temporarily activated, it develops a vertical force of attraction sufficient to radially hold base 6. A spring washer 17 urges electromagnet 16 constantly against the lower surface of base 6, while a return spring 18, one of the ends of which is fastened to mounting base 1 and the other of which works together with a pin 19 extending from the electromagnet 16 from the side opposite base 6, returns the electromagnet permanently to a middle angular position in order to prevent the winding of electric feed wires 20.

Figure 2:
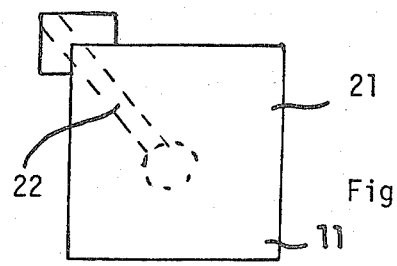
FIG. 2 is a plan view of a suction nozzle of a gripping device of FIG. 1.

In FIG. 2, one preferred embodiment of suction nozzle 11 is shown in plan view. The nozzle 11 is formed by a transparent square sheet 21 made, for example, of a synthetic material of the type known by the trademark "Plexiglass." Sheet 21 contains a radial feed channel 22 capable of being connected to a low pressure source and emerging in the center of the lower face of the nozzle against which the microplate must be retained by suction. Radial channel 22 extends preferably along a diagonal of square sheet 21, so as not to interfere with the view of the fastening lugs of the microplate, which also usually has a square configuration, the fastening lugs being connected only on its sides.

The use of the device according to the invention is particularly simple. The gripping device having carried a microplate 12 so that its axis is approximately superposed on axis 4 and electromagnet 16 not being excited, the operator rapidly moves XY table 5 over plate 2 in order to move the axis of substrate 10, or to move the site of the substrate which is to receive microplate 12 along an extension of the axis of the microplate. Then, after having activated electromagnet 16 to block the translation movements of base 5, the operator rotates XY table 5 in rotation on axis 4 in order to angularly align the plate 12 and the substrate 10. If necessary, all that is left to do is to complete the positioning of the substrate by maneuvering the XY table. All of the operations are monitored by means of optical device 15, which may consist of a microscope or a television camera. When the relative positioning of the substrate and microplate is correct, the gripping device deposits the plate vertically. If necessary, the substrate-plate assembly can then be realigned in relation to the position of the tool, visualized, for example, by means of a reference mark associated with the optical device.

Although this invention has been described in connection with one particular embodiment, this invention lends itself to numerous variants and modifications, which will be apparent to one skilled in the art.

For example, the optical device can be associated with a unit for automatic control of the translation and/or rotational movements of table 5.

Additionally, electromagnet 16 could also be replaced by any other device fulfilling the same function, such as a cylindrical suction nozzle.

According to still another variation, plate 2 could be mounted in free rotation on mounting base 1 and contain any blocking device to stop the translation of base 6.

What is claimed is:

1. A device for the alignment of a part and of a substrate designed to receive said part, said device comprising:
    a plate having a horizontal flat upper surface, said plate being mounted on a fixed base;
    an XY moving table connected with a movable base, said movable base mounted for sliding movement relative to said upper surface of the plate, said table supporting said substrate;
    a blocking device for momentarily preventing translational movement of the movable base on said upper surface, but allowing said base to rotate about a given vertical axis;
    a gripping device to bring the part over the substrate approximately along said given vertical axis and to deposit it vertically onto said substrate; and
    an optical device for viewing the part and the substrate with the direction of observation being along said given vertical axis.

2. A device according to claim 1, wherein said blocking device comprises an electromagnet freely mounted to rotate along said given vertical axis, said electromagnet being mounted in a bore in said plate, said plate being firmly fastened to said fixed base, said electromagnet developing a force of attraction sufficient to hold the movable base of the XY moving table radially when it is temporarily activated.

3. A device according to claim 2, comprising a spring washer in said bore of said fixed base urging said electromagnet against a lower surface of the movable base.

4. A device according to claim 2 or 3, comprising a spring member acting to angularly return said electromagnet, said spring member working with a pin extending from the electromagnet from the side opposite the movable base.

5. A device according to claim 2 or 3, wherein said gripping device contains a transparent suction nozzle.

6. A device according to claim 5, wherein said nozzle comprises a square sheet containing a radial feed channel emerging in the center of said sheet.

7. A device according to claim 6, wherein said feed channel extends along one of the diagonals of the square sheet.

8. A device according to claim 2 or 3, wherein said movable base contains on its lower surface at least one recess selectively connected to a high or low pressure source.

* * * * *